United States Patent [19]

Iizuka et al.

[11] Patent Number: 5,525,106
[45] Date of Patent: Jun. 11, 1996

[54] LOAD STORING EQUIPMENT WITH CLEANING DEVICE

[75] Inventors: Yukio Iizuka; Kibo Miyajima, both of Komaki, Japan

[73] Assignee: Daifuku Co., Ltd., Osaka, Japan

[21] Appl. No.: 222,910

[22] Filed: Apr. 5, 1994

[30] Foreign Application Priority Data

Apr. 12, 1993 [JP] Japan .................... 5-83709

[51] Int. Cl.⁶ ........................................... F24F 3/16
[52] U.S. Cl. .................. 454/187; 55/385.2; 55/470
[58] Field of Search ....................... 55/385.2, 470, 55/471, 472, 473; 454/56, 57, 58, 60, 187, 193

[56] References Cited

U.S. PATENT DOCUMENTS

| | | | |
|---|---|---|---|
| 3,080,695 | 3/1963 | Hay ........................... | 55/470 |
| 4,986,715 | 1/1991 | Asakawa ................. | 454/57 X |

FOREIGN PATENT DOCUMENTS

| | | | |
|---|---|---|---|
| 22933 | 1/1987 | Japan ......................... | 454/187 |
| 217036 | 9/1987 | Japan ......................... | 454/60 |
| 3-152004 | 6/1989 | Japan . | |

*Primary Examiner*—Harold Joyce
*Attorney, Agent, or Firm*—Barnes, Kisselle, Raisch, Choate, Whittemore & Hulbert

[57] ABSTRACT

A plurality of shelves (14) having an storage space (13) are provided in the vertical direction, each of which is open in a front face and closed on the side of a back face with a space (16) by a cover (11), a clean air supply unit (20) comprising a fan (23) and a filter (22) is provided vertically in plural levels, and air inlets (17, 18A and 18B) are formed on the side of the cover (11).

By driving the fans, air can be inspired from within the space, discharged, cleaned to a high cleanliness through a filter, and supplied from the side of the back face to the shelves. Cargos stored in the storage spaces are maintained at a high cleanliness by the clean air flowing from the back face to the front face. Since the space is subject approximately to the barometric pressure, any dirty air that has not passed through the filter is prevented from leaking to the side of shelves and to the outside from a joint of the cover. Because no space is required for placing various devices below the shelves, the entire structure can be simplified, thus reducing the size thereof, and enhancing efficient utilization of space.

7 Claims, 5 Drawing Sheets

LOAD STORING EQUIPMENT WITH CLEANING DEVICE

FIELD OF THE INVENTION

The invention relates to a load storing equipment with cleaning device used for storing such products that isolation from dusts is critical as semiconductors.

BACKGROUND OF THE INVENTION

Conventionally, for such type of equipment is provided, for example, a load storing equipment in a clean room is provided in Japanese Laid-open Patent No. 3-152004. In such conventional structure, a load storage part is provided with both front and back faces being open, filters placed in the back face side of the load storage part, and an air supply path formed in the back of the filters through partition walls. Then, a fan having an air outlet in communication with the air supply path is placed beneath the load storage part, so that clean air passing through the load storage part is drawn by the fan through a suction part. A shell of the main body is employed backside the partition walls so that an air collecting path is formed between the partition walls and the shell, and comes in communication with a section chamber in which the fan is placed.

According to such conventional structure, a flow of air discharged from the air outlet of the fan is directed upward in the air supply path, cleaned to a high cleanliness while passing through the filters, and supplied from the back face side to the load storage part. Therefore, within the load storage part, the high cleanliness is maintained by the clean air flowing from the back face to the front face. The clean air flowing across the load storage part is succeedingly aspired by the fan, and recirculated for repetitive use.

In such operation, because a suction force of the fan also effects to the air collecting path, and induces a negative pressure in the air collecting path, a dirty air leaking to the air collecting path from a joint of the partition walls is, therefore, immediately drawn into the fan by means of the suction force, and never flows outside.

According to the conventional structure, however, as the air supply path is at a high positive pressure, a dirty air that has not passed through the filter may leak from the joint between a back frame forming the load storage part and the filter, and flow into the load storage part. Therefore, application of such laborsome and expensive sealing as coking has been required to the joint. In addition, the structure has been complicated, because of the air collecting path formed through the partition wall in the backside of the air supply path. Moreover, the entire system has been cumbersome, and the lowermost shelf of the load storage part has been at a high level, causing an inefficient use of space, as a section chamber for the fan is formed beneath the load storage part. Although such arrangement that the fan is placed above the load storage part may be considered, the entire system comes to be cumbersome similarly as the case already mentioned, where the filter is placed beneath the storage part.

SUMMARY OF THE INVENTION

Hence, it is an object of the invention to provide a load storing equipment with cleaning device that is simple and compact, allows more efficient use of space in its entire structure, yet, prevents any dirty air from leaking to the shelves, and is capable of maintaining an even supply of clean air regardless of type and size.

In order to achieve the object, a load storing equipment with cleaning device of the invention is provided with a plurality of shelves having an storage space in the vertical directions, wherein the shelf is open in a front face, and closed in the side of a back face by a cover with a space, a clean air supply unit comprising a fan and a filter is employed vertically in the space at plural levels, and an air inlet formed in the side of the cover.

According to such structure of the invention, an air within the space can be aspired by driving the fans, and a feed-in air is supplied to the shelves from the back face, after it is cleaned to a high cleanliness through the filter. Therefore, loads stored in the storage spaces of shelves are maintained at a high cleanliness by the clean air flowing from the back face to the front face.

Because the storage space is approximately at the barometric pressure (a slightly negative pressure by a suction force of the fan) during operation of the clean air supply unit, air with a lower cleanliness in the space never leaks to the side of shelf without passing through the filter of clean air supply unit or from a joint of the cover to outside. Thus, sealing and specific leak-proof structure as coking are eliminated, and the entire system can be provided in a simple structure and at a lower cost. In addition, because the clean air supply unit is employed vertically at plural levels, no space for various devices (e.g. fan) is required in a lower part of the shelf. Therefore, a more efficient use of space is provided, because the entire structure can be simplified, and reduced in size as it is constructed to a lower height, and the storage space in the lowermost shelf is at a lower level.

In a first embodiment of the invention, the clean air supply unit is provided in plural rows in the horizontal direction.

According to such arrangement of the first embodiment, shelves elongated in the horizontal direction can be easily and sufficiently addressed to.

In a second embodiment of the invention, an air inlet is provided so as to face against an upper part of the space.

According to such arrangement of the second embodiment, when an air within the space is aspired by driving the fans, a supply air is automatically fed into the space through the air inlet in the upper part.

In a third embodiment of the invention, an air inlet is provided so as to face against a lower part of the space.

According to such arrangement of the third embodiment, when an air within the space is aspired by driving the fans, a supply of air is automatically fed into the space through the air inlet in the lower part.

In a forth embodiment of the invention, air inlets are provided so as to face against upper and lower parts of the space.

According to such arrangement of the forth embodiment, when an air within the space is aspired by driving the fans, a supply of air is automatically fed into the space through the air inlets in the upper and lower parts.

In a fifth embodiment of the invention, an inlet air volume adjustment device is employed respectively in the clean air supply units for adjusting a volume of air inspired from the space.

According to such arrangement of the fifth embodiment, the inlet air volume adjustment device of the clean air supply unit located closer to the air inlet to the space can be adjusted to a lower void ratio, that of the clean air supply unit located intermediately to an intermediate void ratio, and that of the clean air supply unit located distant from the air inlet to a higher void ratio. Thus, by reducing the suction volume of clean air supply units closer to the air inlet, an air drawn into the space from the air inlet by driving the fans can be evenly inspired by the suction part of clean air supply units.

Moreover, a variation of air pressure (unevenness of clean air supply) to the storage spaces that may result from such provision of plural fans can be corrected by adjustment of the inlet air volume adjustment device. Accordingly, a clean air is evenly supplied to the shelves regardless of variations in type due to any difference in air inlets and that in height due to difference in size, as well as whether it is upper or lower part of a shelf.

In a sixth embodiment of the invention, the inlet air volume adjustment device comprises plural types of meshed panels, and a selected one of the panels is detachably placed to the main body of clean air supply unit so as to face against the suction part thereof.

According to such arrangement of the sixth embodiment, by providing the plural types of meshed panels having different void ratios, the suction volume can be easily adjusted at a lower cost.

EMBODIMENT

Figure 1:
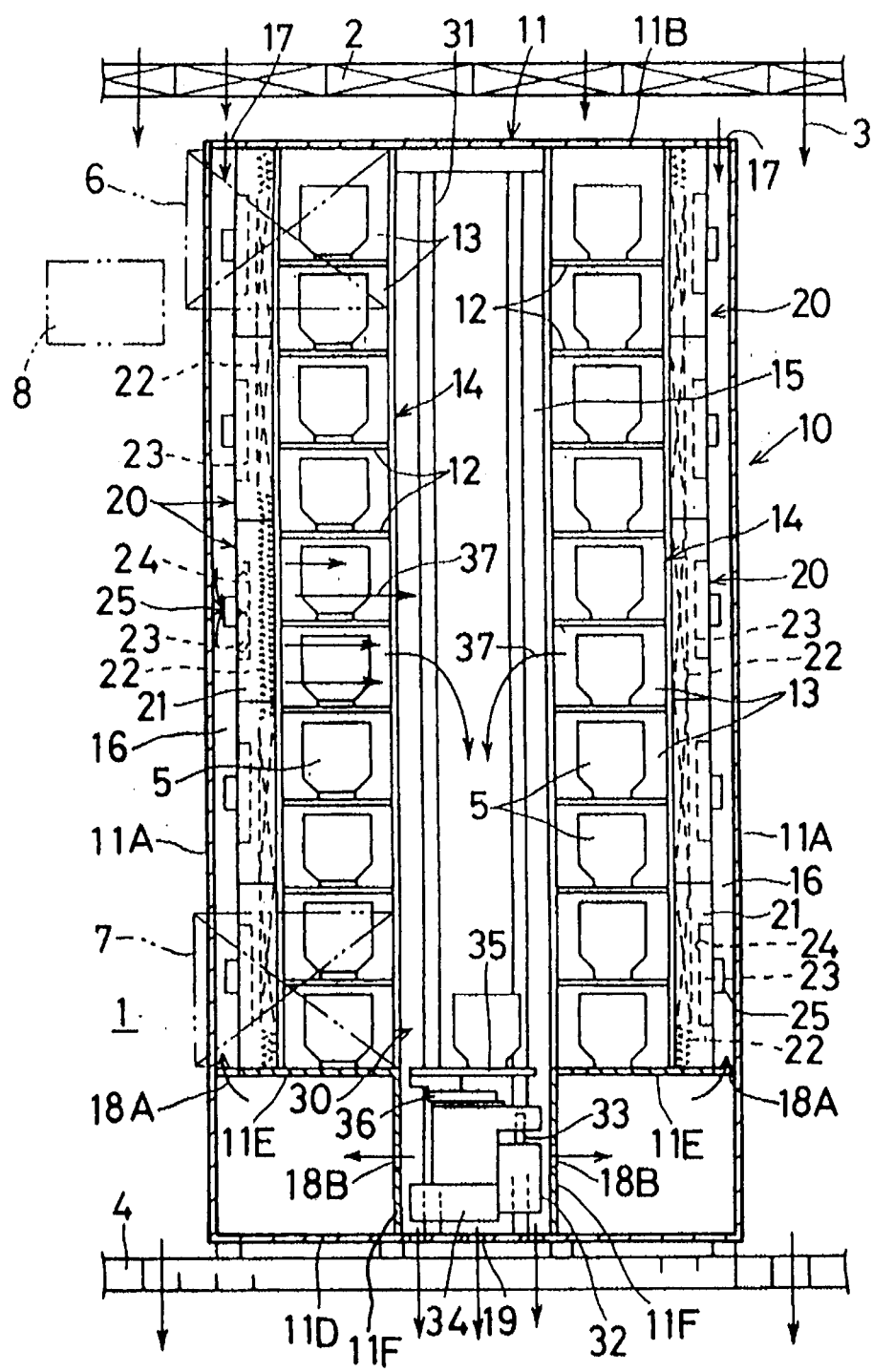
FIG. 1 is a partly cutaway front view of a load storing equipment with cleaning device according to an embodiment of the invention.
Figure 2:
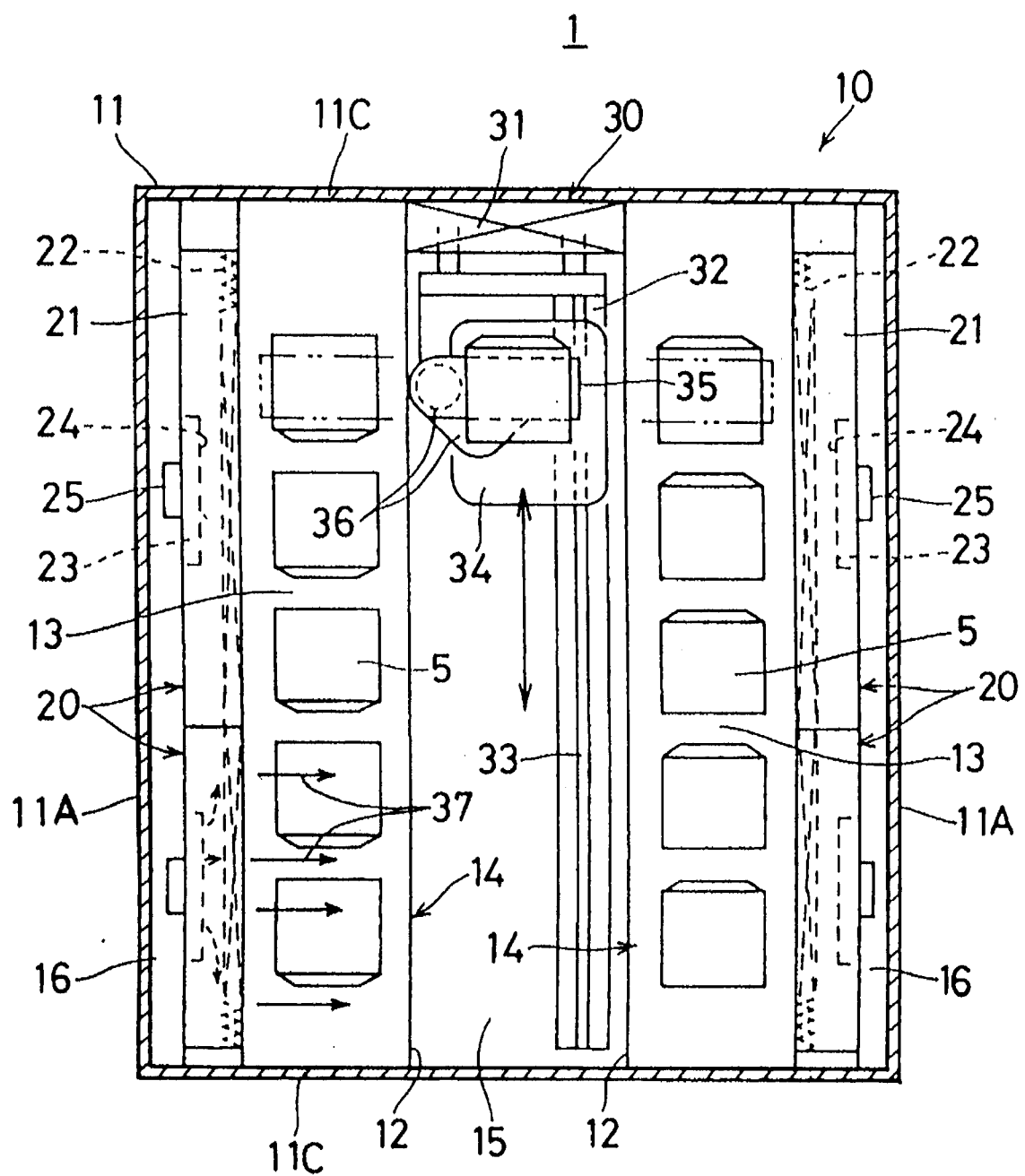
FIG. 2 is a sectional view of the load storing equipment with cleaning device.

By referring to FIGS. 1 and 2, an embodiment of the invention is described below.

Numeral 1 shows a clean room which is constructed such that a clean air 3 is blown downward through a filter 2, and aspired through a floor 4 of a meshed structure to beneath the floor. Numeral 10 shows an enclosed type of load storing equipment with cleaning device, and shelves 14 sectioning and forming plural storage spaces 13 in the vertical direction are formed in a pair with a front face facing against a passage 15 by shelf boards 12 within a box-type shell 11 (an example of cover) of the main body.

The shelves 14 are open in the front face toward the passage 15 and the back face in the opposite side, and a space 16 is formed between the back face and a back panel 11A of the shell 11 of main body. Within the space 16, a clean air supply unit 20 is provided in five shelves in the vertical direction, so as to cover the back face of the load storage part 14. In the first embodiment, although the clean air supply unit 20 is provided in two horizontal rows, they may be in a row or two or more rows.

The shell 11 of main body comprises such components as the back panel 11A, top panel 11B, side panel 11C, bottom panel 11D, partition panel 11E located below the shelves 14 and front panel 11F. A part of the cover is formed by an appropriate one of the panels 11A to 11F.

The clean air supply unit 20 consists of such components as a a main body 21 of a square frame type with a front face being open, a filter 22 placed so as to cover the front face of the main body 21 and a fan 23 employed in the side of back face of the main body 21. The fan 23 has an discharge part 24 facing the filter 22 and a suction part 25 opened to the space 16.

Within the passage 15, a carriage 30 is provided. The carriage 30 comprises such components as a support frame 31 vertically employed in a distant area of the passage 15, a liftable table 32 associated with a lift driving device that is provided in the support frame, a guide rail 33 located on the liftable table 32 and extended approximately through an entire longitudinal dimension of the passage 15, a movable table 34 guided by the guide rail 33 and moved along the front face of racks 14 and a load handling device 35 on the movable table 34. The load handling device 35 is horizontally retractable by means of a link motion 36.

In a part of the top panel 11B facing to an upper portion of the space 16 and a part of the partition panel 11E facing to a lower part of the space 16, air inlets 17 and 18A, respectively, and an air inlet 18B is formed in the front panel 11F so as to provide a communication between the passage 15 and a lower part of the space 16. In addition, an air outlet 19 is formed in a part of the bottom panel 11D facing against the passage 15. The air inlets and outlet 17, 18A, 18B and 19 are either porous or slit structure. Numeral 5 shows a load to be handled.

In the load storing equipment with cleaning device 10, delivery and shipment devices are provided for carrying the load 5 in and out the equipment. Such delivery and shipment devices may be of various types, and a delivery device 6, for example, is provided in a row of racks 14 by utilizing a part of the storage space 13 in the upper shelves, as shown by a phantom line in FIG. 1, and a shipment device 7 by utilizing a part of the storage space 13 in the lower shelves. In this case, the delivery and shipment devices 6 and 7, respectively, have an openable door member or the like, and load transporting means 8 of a type of mobile cart, for example, is provided outside an entrance of the delivery device 6.

Now, an operation of the embodiment is described.

In the load storing equipment with cleaning device 10, a high cleanliness is maintained. That is, an air in the space 16 is aspired from the suction part 25 by driving the fans 23, and discharged into the main body 21 from the discharge part 22. The air discharged is passed through the opposing filter 22, and supplied to the shelves as a clean air 37 with a high cleanliness from the side of back face.

Therefore, the loads 9 stored in the storage spaces 13 of shelves 14 are maintained at a high cleanliness by the clean air 37 flowing from the back face to front face. Then, the clean air 37 passing through the shelves 14 flows into the passage 19, and a part of it is succeedingly discharged through the air outlet 19 to below the floor 14. A most part of the balance air is driven through the air inlets 18B and 18A by means of a suction force caused by driving a group of fans 23, flows into the space 16, and recirculated for repetitive use. In this stage, as a part of the clean air 3 from the ceiling side flows into the space 16 through the air inlet 17 as a replenishment.

During the operation of clean air supply unit 20, although the space 16 is subject to a slightly negative pressure by the suction force of the group of fans 23, as it is approximately at the barometric pressure, any air lower in cleanliness within the space 16 is prevented from leaking out to the side of shelves 14 without passing through the clean air supply unit 20 and from a joint of the back panel 11A to outside. Thus, because no space is required for placing various devices (fans) beneath the shelves, the entire system can be provided in a compact size, and the storage space 13 in the lowermost shelf can be located in a lower level.

The load 5 transported for storage by the load transporting means 8, for example, is received by the carriage 30 by means of the delivery device 6. Then, it is stored in a given accommodation space 13 by a combined operation of lifting motion of the liftable table 32 in the delivery device 30, movement of the movable table 34 and handling motion of the handling device 35 (see solid and phantom lines in FIG. 2). The load 5 in a given storage space 13 can be also shipped by a reverse operation of the carriage 30 by means of the shipment device 7.

Figure 3:
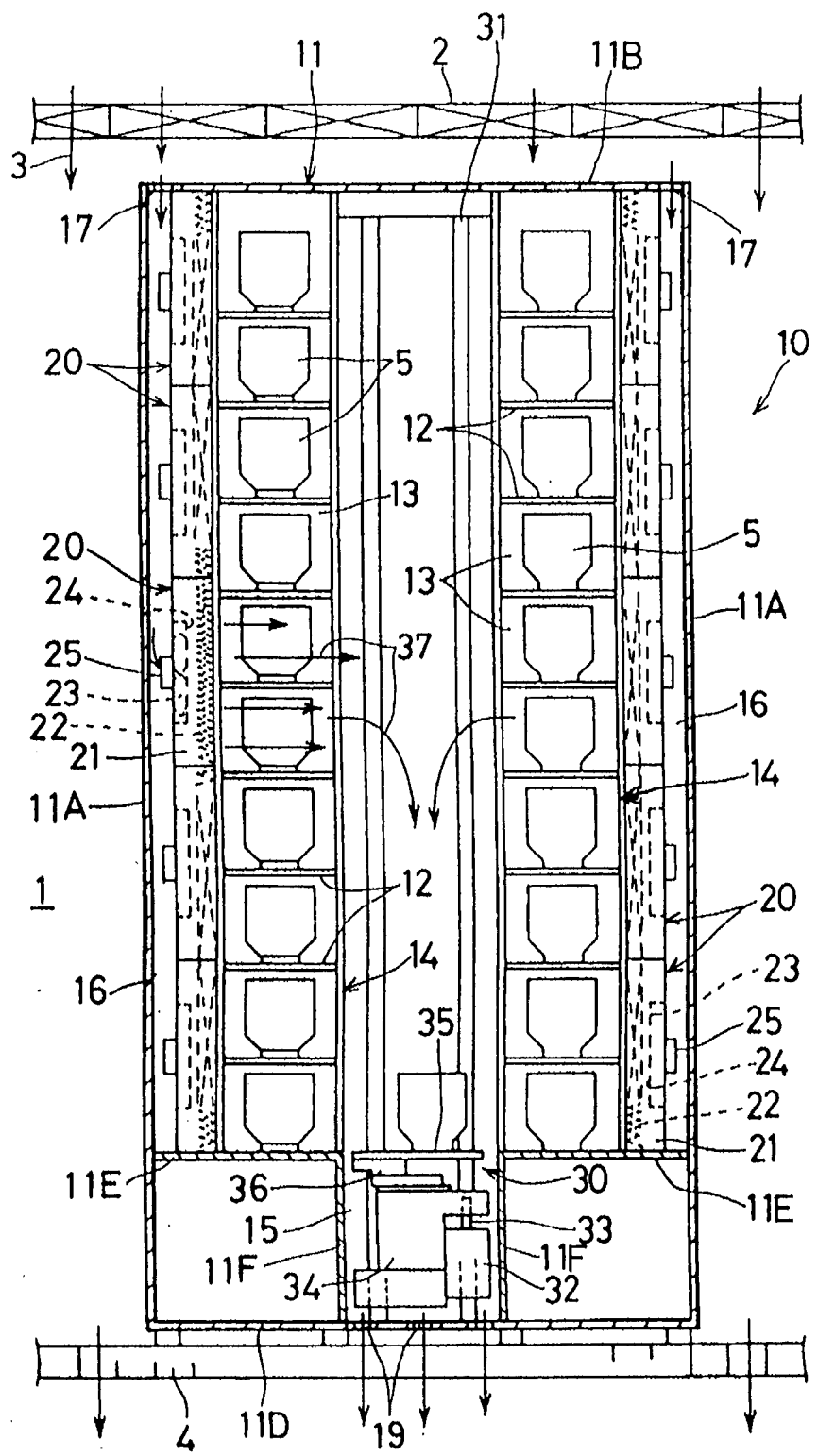
FIG. 3 is a partly cutaway front view of a load storing equipment with cleaning device according to another embodiment of the invention.

In the above embodiment, although a large part of the clean air 37 flowing into the passage 15 and toward downstream is drawn into the space 16 through the air inlets 18B and 18A, and recirculated for repetitive use, the clean air may be completely discharged from the air outlet 19 to beneath the floor 4, as shown in another embodiment in FIG. 3, and an air may be supplied from the air inlet 17 to the space 16.

As described above, the air inlets 17, 18A and 18B may be formed in given locations. In addition, various structures may be employed for the clean air supply unit 20. In other words, in the other embodiment shown in FIGS. 4 and 5, clean air supply units 20 are provided with an inlet air volume adjusting device 40, respectively, for adjusting a volume of air from the side of space 16. In this case, the inlet air volume adjusting device 40 comprises a plural types of meshed panels 41A, 41B, 41C ... 41N having different void ratios, and a selected one of the mesh panels is in opposition to a suction part 25 of the clean air supply unit, and detachable to the main body 21 thereof. Here, the detachable arrangement can be provided by a bolt member 42 inserted through an outer edge of the meshed panels 41A, 41B, 41C ... 41N from outside, and threaded into a nut member 43 fixed to an outer circumference of the suction part 25 of main body 21.

In a discharge part 24 of the main body 21, a panting metal 44 is employed, facing against the side of the shelves 14. In addition, an outside corner of the main body is formed in an arcuate surface 45. An air inlet 46 is also provided in the side of the bottom panel 11D.

In said other embodiment, the clean air supply unit 20 positioned at a lower level and closer to the air inlet 18A to the space 16 is provided with the meshed panel 41C having a lower void ratio, the clean air supply unit 20 at an intermediate level with the meshed plate 41A having an intermediate void ratio, and the clean air supply unit 20 at a higher level distant from the air inlet 18A with the meshed panel 41B having a higher void ratio.

In such manner, because an air drawn into the space 16 from the air inlets 18B and 18A by driving the fans 23 is reduced in volume at a lower level, it is evenly drawn to the suction part 25 of clean air supply units 20. In addition, although the air pressure to the storage spaces 13 is varied (i.e., clean air is unevenly supplied) due to the plural fans 23 in the first and second embodiments, it can be corrected by adjusting the inlet air volume adjusting devices 40, and the clean air 37 is, thereby, evenly supplied from the clean air supply units 20 to the shelves 14.

As a result, regardless of any difference in type due to differences in air inlets and difference in height due to difference in size, the clean air 37 can be always supplied evenly to the shelves 14.

Figure 4:
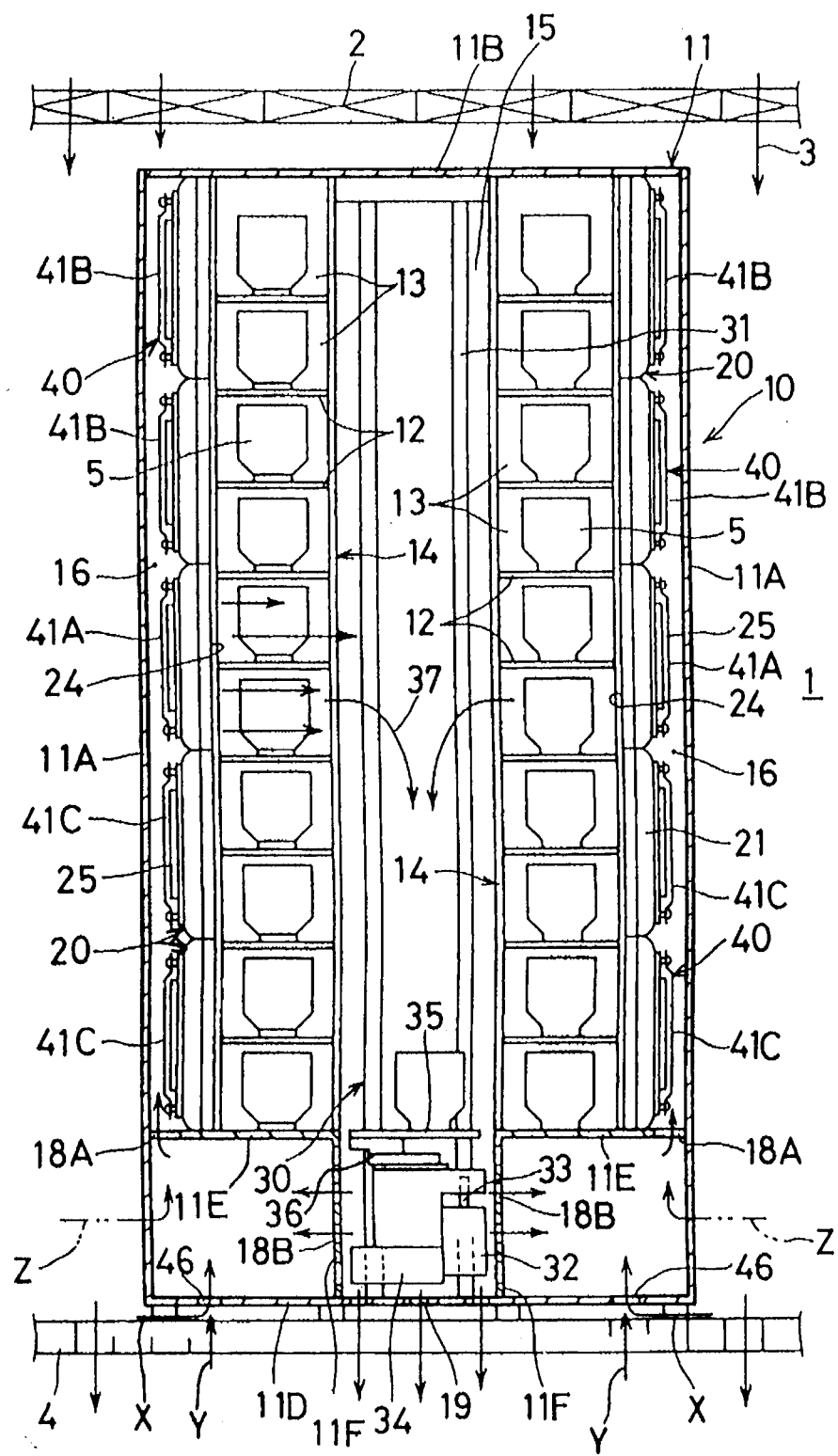
FIG. 4 is a partly cutaway front view of a load storing equipment with cleaning device according to the other embodiment of the invention.
Figure 5:
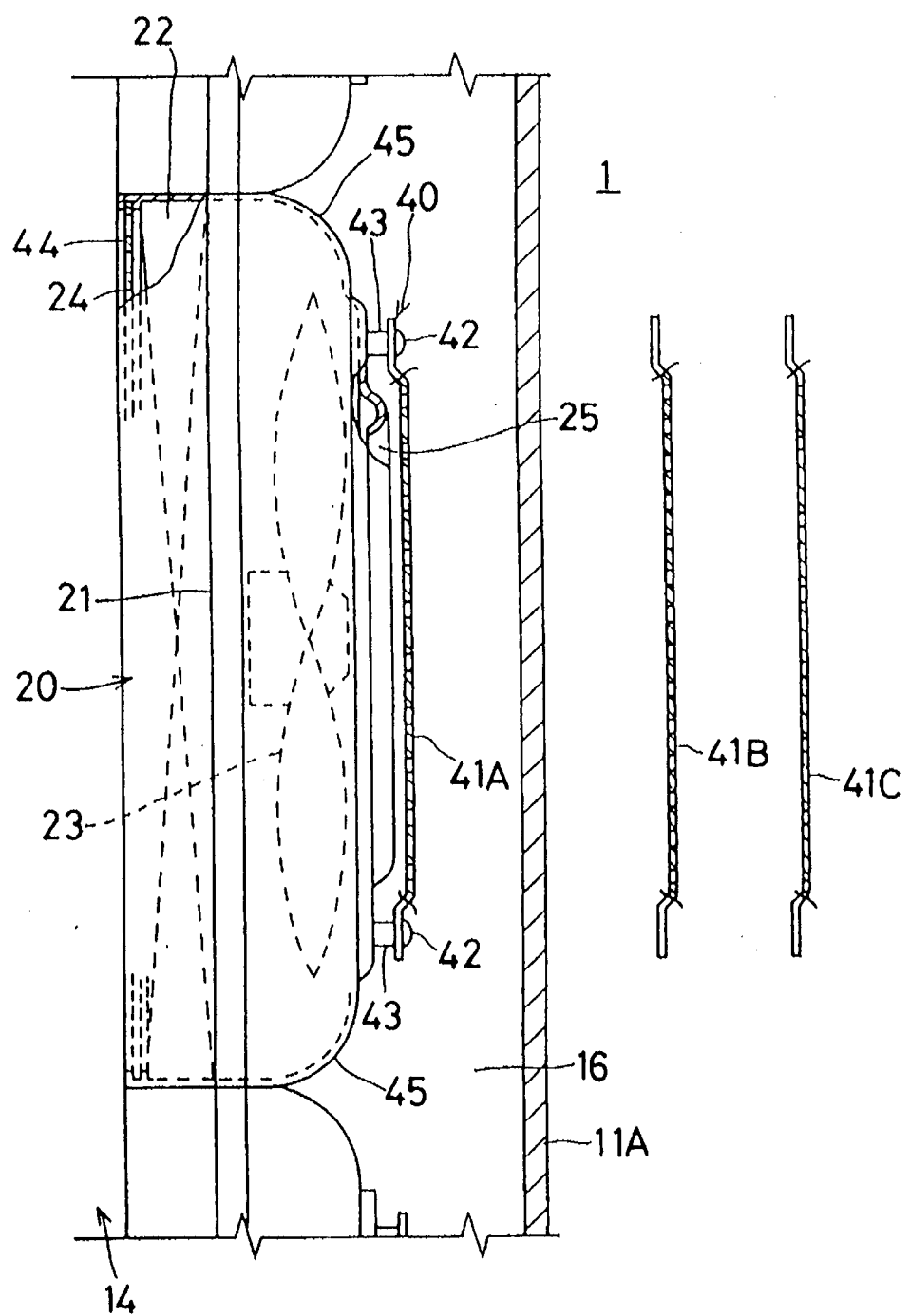
FIG. 5 is a partly cutaway front view of a part of the equipment, showing a clean air supply unit.

Incidentally, a replenishment of air may provided from the side of clean room 1 through an air inlet 46 formed in the bottom panel 11D as shown in solid line X of FIG. 4, from the side of floor 4 through an air inlet 46 formed in the bottom panel 11D as shown in solid line Y of FIG. 4, or from the side of clean room 1 through an air inlet (not shown) formed in the back panel 11A as shown in phantom line Z of FIG. 4. It is also possible to combine them, and provide the replenishment of air from plural locations.

As shown in the embodiment above, by mostly or completely discharging the clean air 37 flowing into the passage 15 and toward downstream from the air outlet 19 to below the floor 4, and using an air in the side of clean room 1 as a replenishment, the air is prevented from being excessively heated by an operating heat of the group of fans 23, hence a thermal effect on the load 5.

In the embodiment above, although the carriage 30 is placed between a pair of rows of shelves, it may be combined with a row of shelves 14, or only a row of shelves may be employed. Moreover, for the carriage 30, such various types may be employed as a crane type in which an entire device is moved and a stationary type that cannot be shifted and moved. Furthermore, although the load storing equipment 10 with cleaning device is installed in the clean room 1, it may be placed in a usual room.

Although plural types of meshed panels 41A, 41B, 41C ... 41N having different void ratios are employed for the inlet air volume adjusting device 40 in said other embodiment (FIGS. 4 and 5), in a sixth embodiment of the invention, the inlet air volume adjusting device 40 may comprise a suction part 25 formed by multiple apertures in the side of main body 21 and a movable porous plate provided rotatably or slidably to the main body 21 such that the void ratio can be changed by varying a communicating area between the apertures by means of the rotating or sliding motion. Alternatively, the inlet air volume adjusting device 40 may be constructed such that the plate is movable with respect to the suction part 25, and the void ratio is changed by varying a spacing between them. Thus, various forms may be employed for the inlet air volume adjusting device 40.

What is to be claimed:

1. A load storing equipment with cleaning device comprising a plurality of shelves in the vertical direction, each of which has a storage space, a front face that is open and a back face that is closed with a space by a cover, a plurality of clean air supply units in the vertical direction in said space adjacent the back face and also in plural rows in the horizontal direction, each of said clean air supply units comprising a fan and a filter, each of said clean air supply units being operable independently of the other clean air supply units, and an air inlet formed in the cover.

2. A load storing equipment with cleaning device as set forth in claim 1, wherein the clean air supply unit is provided transversely in plural rows.

3. A load storing equipment with cleaning device as set forth in claim 1, wherein the air inlet is formed so as to face against an upper part of the space adjacent the back face.

4. A load storing equipment with cleaning device as set forth in claim 1, wherein the air inlet is formed so as to face against a lower part of the space adjacent the back face.

5. A load storing equipment with cleaning device as set forth in claim 1, wherein air inlets are formed so as to face against upper and lower parts of the space adjacent the back face, respectively.

6. A load storing equipment with cleaning device as set forth in any of claims 1 to 5, wherein the independently operable clean air supply units are inlet air volume adjusting devices for adjusting a volume of air inspired from the side of the space adjacent the back face, respectively.

7. A load storing equipment with cleaning device as set forth in claim 6, wherein the inlet air volume adjusting device comprises plural types of meshed panels having different void ratios, and a selected one of the meshed panels is in opposition to a suction part of the clean air supply unit, being detachable to the main body thereof.

* * * * *